United States Patent [19]
Ludowise et al.

[11] Patent Number: 5,400,354
[45] Date of Patent: Mar. 21, 1995

[54] LAMINATED UPPER CLADDING STRUCTURE FOR A LIGHT-EMITTING DEVICE

[76] Inventors: Michael Ludowise, 6355 Slida Dr., San Jose, Calif. 95129; Nick Holonyak, Jr., 2212 Fletcher St., Urbana, Ill. 61801; Stephen J. Caracci, 5443 Portsmouth Way, Centerville, Ohio 45459; Michael R. Krames, 1010 W. Main St., Urbana, Ill. 61801; Fred A. Kish, 1372 Lake Shore Cir., San Jose, Calif. 95131

[21] Appl. No.: 193,681

[22] Filed: Feb. 8, 1994

[51] Int. Cl.$^6$ ............................................. H01S 3/19
[52] U.S. Cl. ..................................... 372/46; 372/45; 437/129
[58] Field of Search ............... 372/45, 46; 437/129; 257/13-15

[56] References Cited

U.S. PATENT DOCUMENTS

| | | | |
|---|---|---|---|
| 4,611,328 | 9/1986 | Liu et al. | 372/45 |
| 4,731,789 | 3/1988 | Thornton | 372/45 |
| 4,750,183 | 6/1988 | Takahashi et al. | 372/45 |

FOREIGN PATENT DOCUMENTS

WO92/12536  7/1992  WIPO .

OTHER PUBLICATIONS

Caracci et al., "High-performance planar native-oxide buried-mesa index-guided AlGaAs-GaAs quantum well heterostructure lasers," *Appl. Phys. Lett.* 61 (3), Jul. 20, 1992, pp. 321-323.

Dallesasse et al., "Native-oxide masked impurity-induced layer disordering of $Al_xGa_{1-x}As$ quantum well heterostructures," *Appl. Phys. Lett.* 58 (9), Mar. 4, 1991, pp. 974-976.

Dallesasse et al., "Native-oxide-defined coupled-stripe $Al_xGa_{1-x}As$-GaAs quantum well heterostructure lasers," *Appl. Phys. Lett.* 58 (8), Feb. 15, 1991, pp. 834-836.

Dallesasse et al., "Native-oxide strip-geometry $Al_xGa_{1-x}As$-GaAs quantum well heterostructure lasers," *Appl. Phys. Lett.* 58 (4), Jan. 28, 1991, pp. 394-396.

Dallesasse et al., "Hydrolyzation oxidation of $Al_xGa_{1-x}As$-AlAs-GaAs quantum well heterostructures and superlattices," *Appl. Phys. Lett.* 57 (26), Dec. 24, 1990, pp. 2844-2846.

Dallesasse et al., "Environmental degradation of $Al_xGa_{1-x}As$-GaAs quantum-well heterostructures," *J. Appl. Phys.* 68 (5), Sep. 1, 1990, pp. 2235-2238.

Dallesasse et al., "Stability of AlAs in $Al_xGa_{1-x}As$-AlAs-GaAs quantum well heterostructures," *Appl. Phys. Lett.* 56 (24), Jun. 11, 1990, pp. 2436-2438.

(List continued on next page.)

Primary Examiner—Georgia Y. Epps

[57] ABSTRACT

A fabrication method for providing a semiconductor light-emitting device includes growing a plurality of layers on a semiconductor substrate, including forming a lower cladding layer and an active region for generating lightwaves. A laminated cladding structure is formed on the active region. The laminated cladding structure includes a lower layer that is substantially aluminum-free to inhibit oxidation and includes an upper layer that is aluminum-bearing in order to promote oxidation. The upper layer of the lamination is oxidized along selected first regions and is selectively masked to prevent oxidation for second regions. The oxidation of the first region is carried out under conditions such that a native oxide is formed throughout the thickness of the first regions. Electrical current to the active region for operating the light-emitting device is channeled via the unoxidized region of the upper layer of the lamination. In a preferred embodiment, the device is an InGaAsP-AlInAs-InP laser. Other electronic devices, such as FETs, can be also formed using the top-down approach. Preferably, oxidation is limited to an upper III-V semiconductor layer by forming a lower III-V semiconductor layer that includes In and/or P. Lateral oxidation can also be realized using this approach.

23 Claims, 3 Drawing Sheets

OTHER PUBLICATIONS

El-Zein et al., "Resonance and switching in a native-oxide-defined $Al_xGa_{1-x}As$–GaAs quantum-well heterostructure laser array," *Appl. Phys. Lett.* 61 (6), Aug. 10, 1992, pp. 705–707.

El-Zein et al., "Native-oxide coupled-cavity $Al_xGa_{1-x}As$–GaAs quantum well heterostructure laser diodes," *Appl. Phys. Lett.* 59 (22), Nov. 25, 1991, pp. 2838–2840.

El-Zein et al., "Native-oxide-masked Si impurity-induced layer disordering of $Al_xGa_{1-x}As$–$Al_yGa_{1-y}As$–$Al_zGa_{1-z}As$ quantum-well heterostructures," *J. Appl. Phys.* 70 (4), Aug. 15, 1991, pp. 2031–2034.

Kish et al., "Properties and Use of $In_{0.5}(Al_xGa_{1-x})_{0.5}P$ and $Al_xGa_{1-x}As$ Native Oxides in Heterostructure Lasers," *Journal of Electronic Materials*, vol. 21, No. 12, 1992, pp. 1133–1139. No Month.

Kish et al., "Dependence on doping type (p/n) of the water vapor oxidation of high-gap $Al_xGa_{1-x}As$," *Appl. Phys. Lett.* 60 (25), Jun. 22, 1992, pp. 3165–3167.

Kish et al., "Planar native-oxide $Al_xGa_{1-x}As$–GaAs quantum well heterostructure ring laser diodes," *Appl. Phys. Lett.*, 60 (13), Mar. 30, 1992, pp. 1582–1584.

Kish et al., "Planar native-oxide buried-mesa $Al_xGa_{1-x}As$–$In_{0.5}(Al_yGa_{1-y})_{0.5}P$–$In_{0.5}(Al_zGa_{1-z})_{0.5}P$ visible-spectrum laser diodes," *J. Appl. Phys.* 71 (6), Mar. 15, 1992, pp. 2521–2525.

Kish et al., "Coupled-stripe in-phase operation of planar native-oxide index-guided $Al_yGa_{1-y}As$–GaAs–$In_xGa_{1-x}As$ quantum-well heterostructure laser arrays," *Appl. Phys. Lett.* 60 (1), Jan. 6, 1992, pp. 71–73.

Kish et al., "Visible spectrum native-oxide coupled-stripe $In_{0.5}(Al_xGa_{1-x})_{0.5}P$–$In_{0.5}Ga_{0.5}P$ quantum well heterostructure laser arrays," *Appl. Phys. Lett.* 59 (22), Nov. 25, 1991, pp. 2883–2885.

Kish et al., "Planar native-oxide index-guided $Al_xGa_{1-x}As$–GaAs quantum well heterostructure lasers," *Appl. Phys. Lett.* 59 (14), Sep. 30, 1991, pp. 1755–1757.

Kish et al., "Native-oxide stripe-geometry $In_{0.5}(Al_xGa_{1-x})_{0.5}P$–$In_{0.5}Ga_{0.5}P$ heterostructure laser diodes," *Appl. Phys. Lett.* 59 (3), Jul. 15, 1991, pp. 354–356.

Kish et al., "Low-threshold disorder-defined native-oxide delineated buried-heterostructure $Al_xGa_{1-x}As$–GaAs quantum well lasers," *Appl. Phys. Lett.* 58 (16), Apr. 22, 1991, pp. 1765–1767.

Richards et al., "Native-oxide coupled-stripe $Al_yGa_{1-y}As$–GaAs–$In_xGa_{1-x}As$ quantum well heterostructure lasers," *Appl. Phys. Lett.* 58 (21), May 27, 1991, pp. 2390–2392.

Sugg et al., "Native oxide stabilization of AlAs–GaAs heterostructures," *Appl. Phys. Lett.* 58 (11), Mar. 18, 1991, pp. 1199–1201.

LAMINATED UPPER CLADDING STRUCTURE FOR A LIGHT-EMITTING DEVICE

RIGHTS OF THE GOVERNMENT

The invention described herein may be manufactured and used by or for the government of the United States for all governmental purposes without the payment of any royalty.

DESCRIPTION

1. Technical Field

The present invention relates generally to light-emitting devices and more particularly to semiconductor diodes and laser diodes and methods of fabricating such devices.

2. Background Art

Semiconductor laser diodes play an important role in a wide variety of fields, such as lightwave communications. Semiconductor lasers may be used in lightwave instrumentation, i.e. instruments for testing and characterizing fiberoptic communication systems, as well as being used as signal-generating components of a fiber-optic system. Light-emitting diodes have also found use in an increasing number of fields.

There are a variety of light-emitting diode and laser structures. One common objective is to provide a generally planar device that produces a high quality optical waveguide. Another objective is to obtain a high degree of current confinement within a region that defines an active waveguide of the device. Moreover, obtaining a specific wavelength of emitted light is important to many applications.

One known design of a light-emitting semiconductor device is referred to as a V-groove crescent laser. Proper fabrication of this structure is dependent upon unique features of liquid-phase epitaxy (LPE). While the V-groove crescent laser has met with success, it is not suitable for fabrication by vapor growth techniques.

Another type of semiconductor light-emitting device is a ridge waveguide laser that permits more versatility in fabrication than the V-groove crescent laser. Planar epitaxial layers may be successively grown by either LPE, vapor-phase epitaxy (VPE), or metalorganic chemical vapor deposition (MOCVD). The layers are then etched to form a ridge, whereafter standard dielectric deposition, photolithographic, and metallization techniques are employed to form the remainder of the device. The critical dimensions of the ridge waveguide laser are the width of the ridge and the spacing between an active region and an oxide layer above the active region. The active region may be of the bulk type or of the quantum well type without significantly changing any of the device fabrication techniques. However, the structure is inherently non-planar and consequently presents challenging processing problems.

A third known structure is referred to as a buried heterostructure (BH) laser. The laser is formed by sequentially growing a lower cladding layer, an active layer and an upper cladding layer in a planar manner using conventional growth processing. A mesa stripe is then formed using masking and etching techniques. Then, either an InP:Fe or an InP p-n-p current-blocking layer is formed by an epitaxial regrowth. Contact metal is added after the regrowth. This structure has been successfully fabricated in laboratory environments, but is not commercially available. Maintaining the quality of the active region is problematic during a second (overgrowth) crystal growth step, particularly if the structure includes quantum wells. The primary advantage of the structure is that the semi-insulating InP:Fe layer allows the formation of a low-capacitance contact for high frequency applications. Additionally, the BH laser provides a structure which is more index-guided than the ridge waveguide laser. The added process costs, complexities, and yield losses are tolerable if high frequency operation is critical to a particular application.

Another semiconductor light-emitting structure is described by Kish et al. in "Planar Native-Oxide Index-Guided $Al_xGa_{1-x}As$-GaAs Quantum Well Heterostructure Lasers," *Applied Physics Letters*, Vol 59, pages 1755–1757, Sep. 30, 1991. Oppositely doped cladding layers of AlGaAs sandwich a waveguide region of undoped AlGaAs having an undoped quantum well grown in the center of the region. A heavily doped cap layer is then grown. Silicon nitride is deposited and patterned on the cap layer to form stripes which serve as a mask for chemically etching the cap layer. The etching exposes portions of the upper confining layer. The exposed portions are subjected to a wet-oxidation process wherein almost the entire thickness of the upper confining layer is transformed to a native oxide. Thus, the upper cladding layer remains unoxidized at the interface with the waveguide region, as well as under the GaAs: cap. Some undercutting takes place beneath the GaAs cap, but an unoxidized ridge is formed by the use of the silicon nitride and the cap layer as a mask to inhibit oxidation. The silicon nitride is then removed.

The structure described in Kish et al. achieves the necessary waveguide, because the index of refraction step between the native oxide and the ridge in the upper cladding layer function in a manner similar to a ridge waveguide laser. The critical dimensions are the width of the ridge (i.e., the width of the active stripe embedded in the native oxide) and the thickness of that portion of the upper cladding layer that remains unoxidized along the entire interface of the upper cladding layer and the waveguide region. This restricts the flexibility of selecting the growth thickness of the upper cladding layer. Moreover, the structure is potentially susceptible to low fabrication yield in a production environment, since the wet oxidation must be carried out for a sufficient time to allow the oxidation to achieve the necessary undercutting and penetration, but must be terminated before the oxidation reaches undesirably close to the interface of the upper cladding layer and the active region.

Current InGaAs laser structures having InP-based cladding layers have been operating in the long wavelength range of 1.3–1.55 μm. An InP upper cladding layer cannot be oxidized in the manner described by Kish et al., since the oxidation is dependent upon the presence of a cladding layer of sufficiently high aluminum content. What is needed is a widely applicable method of making a semiconductor light-emitting device in which a desired index of refraction step is achieved in a planar structure without complicated regrowth or exacting processing. More generally, what is needed is a method of fabricating a semiconductor device wherein oxidization parameters are reliably repeatable.

SUMMARY OF THE INVENTION

The present invention provides a fabrication method and an electronic device in which a first semiconductor layer is formed to include an element that is selected to inhibit oxidation of the first layer and an oxidizable second semiconductor layer is formed atop said first layer, whereafter a selected region of said second layer is oxidized to the interface of the two layers. Unoxidized regions of the second layer are utilized to provide an electrical path from a top contact layer to the first layer. As an alternative to a top-down oxidation approach, the oxidizable layer can be sandwiched between two semiconductor layers having an element selected to inhibit oxidation, whereafter the oxidizable layer is oxidized in a lateral direction. Using either approach, electronic devices such as transistors and light-emitting diodes and lasers are formed.

In a first embodiment, the invention provides a semiconductor light-emitting device having desired optical properties by forming a laminated cladding structure atop an active region of a semiconductor light-emitting diode or laser. A lower film in the lamination is selected of a semiconductor material having desired properties with respect to defining optical and current paths and with respect to inhibiting oxidation. The lower film preferably has at least one of the elements of indium and phosphorus. These elements each inhibit oxidation and when combined as an InP cladding layer have contributed to light-emitting operation in the long wavelength range of 1.3–1.55 $\mu$m. An upper film in the lamination is selected of a semiconductor material having desired properties with respect to permitting current flow when in an unoxidized state and with respect to oxidation susceptibility. An aluminum-bearing III-V semiconductor material is preferred. Selected regions of the upper semiconductor film are oxidized throughout the entire thickness of the upper film. The lower semiconductor film functions to prevent the oxidation from penetrating beyond the thickness of the upper film. Unoxidized regions of the upper film may then be utilized to provide a current path between the active region and a contact on the upper surface of the upper film, as well as to provide the necessary index stop to induce waveguiding.

Typically, the semiconductor light-emitting device is formed on a semiconductor substrate. Conventional techniques are employed to form the layers on the semiconductor substrate, which include a lower cladding layer and the active region for generating lightwave energy in response to current flow. Preferably, the active region includes quantum wells, but this is not critical. The lower film of the laminated cladding structure on the active region is preferably a III-V layer that is substantially free of aluminum. As previously noted, InP is a suitable material for the lower film. An aluminum-bearing III-V layer, such as AlInAs, is a preferred material for forming the upper film of the lamination.

In the preferred embodiment, the device includes a contact layer which functions either independently or in combination with a mask to cover those portions of the upper film which are to remain unoxidized. While some undercutting of the contact layer will occur, the masking techniques maintain the conductivity of the selected regions of the upper film covered by the contact layer.

An advantage of the present invention is that the thickness of the unoxidized material between the native oxide and the active region is determined solely by the epitaxial growth of the lower film of the lamination. Thus, obtaining the desired thickness of unoxidized material is not dependent upon the duration of the oxidation process or upon an etch time. An improved uniformity in wafer processing of an array of semiconductor devices is achieved, because the structure is less process dependent. Wet-oxide techniques are typically employed in oxidizing the upper film, but oxidation beyond a desired depth is inhibited by the oxidation-retardant lower film.

With regard to the formation of light-emitting devices, another advantage of the present invention is that an index of refraction step from the unoxidized region of the upper film to the native oxide is much larger than that of a buried heterostructure. Consequently, the mode confinement in the lateral direction is at least as great as a BH laser. Current confinement is also at least as great as a BH laser and a ridge waveguide laser, since the quality of the sidewall interface of prior art structures is variable (due to the exposure of the structures to air and chemicals during mesa formation) and consequently the prior art devices are more susceptible to the development of high leakage currents. The native oxide structure is less likely to allow development of high leakage currents.

Yet another advantage of the present invention is that a fully planar device may be fabricated without complicated regrowth processing. This greatly simplifies the processing, leading to a cheaper device which performs as well as or better than commercially available alternatives. The structure is also amenable to high levels of integration, because of the similarity of the processing to Si-oxide technology.

The width of the unoxidized region of the upper film in the lamination is set solely by the oxidation time and the width of the masking material used during the oxidation process. Where the masking material is the contact layer of the device, the invention allows the contact layer to extend to a distance several times greater than the width of the unoxidized region, thereby permitting a lower contact resistance.

BEST MODE FOR CARRYING OUT THE INVENTION

Figure 1:
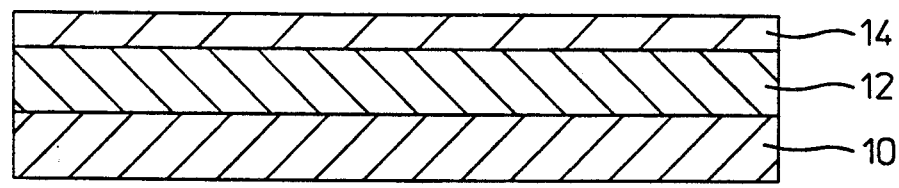
FIG. 1 is a side sectional view of a semiconductor substrate having a lower cladding layer and an active layer in accordance with the present invention.

With reference to FIG. 1, a semiconductor substrate 10 is shown as having a lower cladding layer 12 and an active layer 14. The structure below the active layer is not critical to the present invention. The lower cladding layer and substrate may be replaced with any other known structure. Thus, the techniques for forming layers 12 and 14 and providing the substrate 10 may be of any type known in the art.

An acceptable semiconductor substrate 10 is an InP substrate which is doped with sulfur. For example, a dopant concentration may be $5 \times 10^{18}$ cm$^{-3}$. An n-type lower cladding layer 12 may be grown using conventional epitaxial techniques. Selenium may provide a concentration level of $7 \times 10^{17}$ cm$^{-3}$. An acceptable thickness for the epitaxial cladding layer is 1.5 μm.

Preferably, the active layer 14 includes a separate confining heterostructure (SCH) and a plurality of quantum wells. For example, an $In_{0.81}Ga_{0.19}As_{0.43}P_{0.57}$ SCH layer may be formed having four quantum wells composed of $In_{0.53}Ga_{0.47}As$ in which $L_z = 90$ Å and $L_b = 100$ Å. However, neither the materials nor the dimensions are critical to the present invention.

Figure 2:
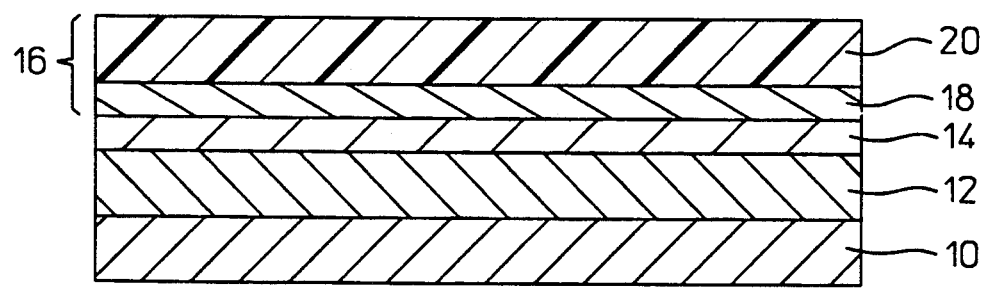
FIG. 2 is a side sectional view of the device of FIG. 1 having a laminated upper cladding structure formed thereon.

Referring now to FIG. 2, a laminated upper cladding structure 16 is shown. The laminated structure includes a first layer 18 that is made of a material selected to be resistant to oxidation. A thicker second layer 20 is formed of a material that is susceptible to oxidation. In the preferred embodiment, the first layer 18 is substantially devoid of aluminum, while the second layer 20 comprises a high percentage of aluminum.

The first layer 18 may have a thickness of 1000 Å. An undoped InP layer may be formed or an InP layer may be doped with a concentration of Zn at a level of $1 \times 10^{17}$ cm$^{-3}$. Devices have been fabricated for which the lower cladding layer 12 and the active layer 14 have been formed by metalorganic chemical vapor deposition (MOCVD), while the first and second layers 18 and 20 have been formed by molecular-beam epitaxy (MBE). However, the use of these separate techniques increases the likelihood that defects will occur at the interface of subsequent levels, so that the preferred method is to form each layer in situ within a fabrication structure selected according to considerations well known in the art. Preferably, MOCVD will be used, although realization of the invention is not dependent upon any particular method of depositing the semiconductor layers.

The thicker second layer 20 of the cladding lamination 16 may be an $Al_{0.48}In_{0.52}As$ layer having a thickness of 1.5 μm and having a beryllium concentration level of approximately $8 \times 10^{17}$ cm$^{-3}$.

Figure 3:
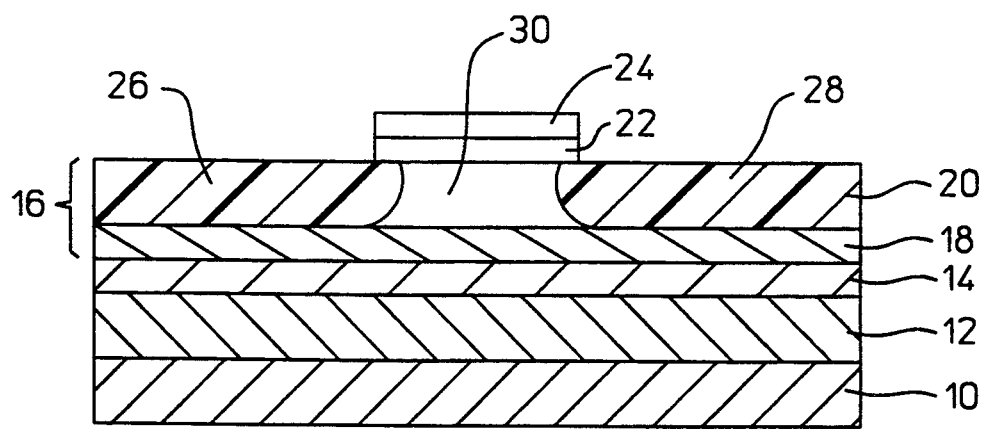
FIG. 3 is a side sectional view of a processing step for selectively oxidizing a second layer of the laminated upper cladding structure of FIG. 2.

In FIG. 3, a contact layer 22 is formed atop the second layer 20 of the laminated cladding structure 16. Typically, the contact layer is formed using conventional epitaxial growth techniques. A masking layer 24 is then formed on the contact layer 22. Photolithographic techniques are utilized to pattern the contact layer and the masking layer to provide the stack shown in FIG. 3. The patterning exposes portions 26 and 28 of the upper surface of the second layer 20.

The contact layer 22 may be a layer of $In_{0.53}Ga_{0.47}As$ with a thickness of approximately 0.75 μm and a Be concentration level of $2 \times 10^{19}$ cm$^{-3}$. The masking layer 24 may be silicon nitride. However, the materials, the concentration levels and the thicknesses may vary in accordance with parameters known in the art.

A wet oxidation process is utilized to oxidize those regions of the second layer 20 that are exposed by the patterned contact and masking layers 22 and 24. The oxidation is initiated at the surface portions 26 and 28 and continues through the entirety of the second layer of the laminated cladding structure 16. The oxidation process may be carried out in an atmosphere of H$_2$O vapor and N$_2$ carrier gas at a temperature of 525° C. and for a period of one hour. These parameters will change with the thickness of the second layer 20 and with other considerations understood by persons skilled in the art.

The regions of the second layer 20 that are below the exposed surface portions 26 and 28 are transformed into a native oxide of the AlInAs material. However, the silicon nitride layer 24 and the contact layer 22 prevent complete oxidation of an underlying region 30. Some undercutting of the contact layer 22 occurs. The degree of undercutting is dependent upon the duration of the wet oxidation process. Thus, the width of the unoxidized region 30 is determined primarily by the oxidation time and the width of the contact layer 22. The undercutting is controllable and can be used to fabricate structures in which the width of the contact layer 22 is several times the width of the unoxidized region 30, thereby providing low contact resistance at the interface of the unoxidized region 30 and the contact layer 22.

Figure 4:
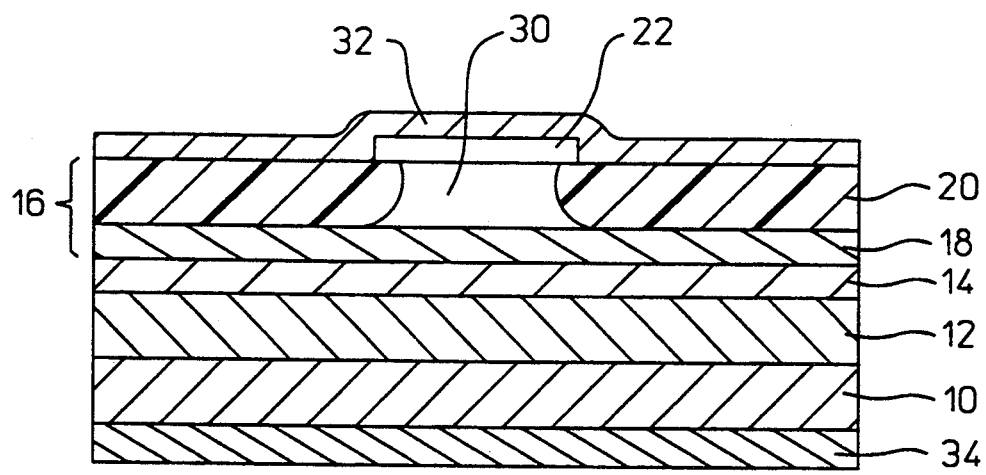
FIG. 4 is a side sectional view of a first embodiment of the present invention formed in accordance with the steps illustrated in FIGS. 1–3.

As shown in FIG. 4, the silicon nitride masking layer 24 is removed and a blanket metal layer 32 is deposited using conventional techniques. A lower metal layer 34 is formed on the underside of the semiconductor substrate 10, as is standard in the art. The voltage levels at the metal layers 32 and 34 will determine current flow through the active layer 14. The preferred embodiment described above provides a laser which operates in the wavelength range of 1.3 μm to 1.55 μm. However, other embodiments are contemplated. Rather than a light-emitting laser, the steps may be utilized to fabricate a light-emitting diode. Moreover, arrays of semiconductor devices having light-emitting capabilities may be formed using the inventive method.

As previously noted, the thickness of the unoxidized region between the active layer 14 and the oxidized regions of the second layer 20 is determined by the epitaxial growth of the first layer 18 in the laminated cladding structure 16. In comparison to the Kish et al. structure that was previously described, improved process uniformity is obtained by the laminated cladding structure by way of compensating for thickness non-uniformities introduced during the formation of the second layer 20. The aluminum-free first layer 18 prevents oxidation beyond the thickness of the second layer 20.

The index of refraction step from the unoxidized region 30 to the native oxide of the second layer 20 is much larger than the step of a buried heterostructure. Thus, mode confinement in the lateral direction should be at least as great as that of BH lasers. Moreover, current confinement is improved, since the sidewall interface is less susceptible to development of high leakage currents.

Figure 5:
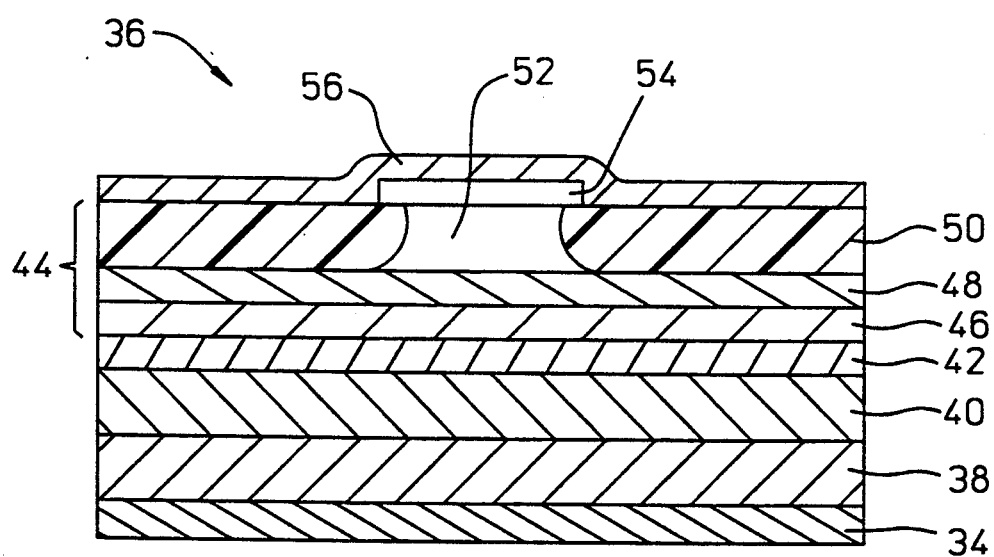
FIG. 5 is a side sectional view of a second embodiment of the present invention.

FIG. 5 is a second embodiment of a light-emitting semiconductor device 36. The device includes an n-type InP substrate 38 and an n-type InP lower cladding layer 40. Atop the lower cladding layer is an InGaAs active region 42 having a quantum well, separate-confinement heterostructure (QW-SCH).

The light-emitting device 36 has a laminated cladding structure 44 comprising first, second and third layers 46, 48 and 50, respectively. The first layer is an undoped film of InP having a thickness of approximately 500 Å. The second layer is an InP film having a thickness of approximately 500 Å and a Zn dopant concentration level of approximately $1 \times 10^{17}$ cm$^{-3}$. The third layer 50 is a layer of Al$_{0.48}$In$_{0.52}$As that is doped with Be. Optimally, the concentration level of the third layer is $1 \times 10^{17}$ cm$^{-3}$ for a lower region of 0.5 μm and is $8 \times 10^{17}$ cm$^{-3}$ for an upper region of 1 μm. An unoxidized region 52 of the third layer is located between native oxide regions. The unoxidized region 52 having a width of between 2 and 4 μm is preferred. Because of the lateral oxide growth that forms undercutting below a contact layer 54, the masking which inhibits oxidization of the third layer should be approximately 6 μm. A conventional metal layer 56 is formed on the light-emitting device 36.

EXAMPLE ONE
LIGHT-EMITTING DEVICE

For reasons related to example only, process parameters for forming the layers described above will be set forth. The InGaAsP quantum well heterostructure (QWH) crystal 14 may be grown by metalorganic chemical vapor deposition (MOCVD). The AlInAs layer 30 and GaInAs contact cap 22 are grown by molecular beam epitaxy (MBE). The structure consists of MOCVD-grown 1.5 μm InP:S 10, $7 \times 10^{17}$ cm$^{-3}$; 1000 Å of $\lambda_g = 1.2$ μm InGaAsP undoped separate confining heterostructure (SCH); 5 quantum wells of $\lambda_g = 1.58$ μm InGaAsP, $L_z = 130$ Å and 4 barriers of $\lambda_g = 1.2$ μm InGaAsP, $L_b = 80$ Å, all undoped; 1000 Å of $\lambda_g = 1.2$ μm InGaAsP undoped SCH; and 1.8 μm of InP:Zn 18, $8 \times 10^{18}$ cm$^{-3}$. An MBE-grown AlInAs:Be, $7 \times 10^{17}$ cm$^{-3}$ layer 30, 0.2 μm thick, and a GaInAs:Be, $2 \times 10^{19}$ cm$^{-3}$ contact cap layer 22 are added to complete the structure. The MOCVD portion of the structure is grown at 640° C. in a horizontal RF-heated low pressure (76 Torr) system, using trimethylindium, triethylgallium, 10% AsH$_3$ in H$_2$ and 100% PH$_3$. A mixture of 50 ppm H$_2$Se in hydrogen and diethylzinc are used as the dopant precursors. The reactor tube has a rectangular cross section of 5.7 cm wide $\times$ 2 cm above the substrate. The total hydrogen flow is 8.7 slpm. Typical PH$_3$ flow is 180 sccm during the InP growth and 150 sccm for the InGaAsP layers. The TMIn flow is held constant at 330 sccm. The sublimer is held at a variable temperature near 17° C. such that the gas concentration of TMIn is 0.090% as measured with an Epison gas densiometer. The AsH$_3$ and TEGa flows are adjusted (typically between 8 and 500 sccm, and 25 and 90 sccm, respectively) to obtain a lattice match of $\Delta a/a_o \leq 2 \times 10^4$ at the desired band-gap. After the MOCVD portion of the growth, the wafer is removed from the MOCVD apparatus and immediately loaded into the MBE chamber.

The MBE portion of the structure is grown at 480° C. in a Varian Gen II chamber using solid sources. The substrates are (100) oriented (with no intentional misorientation) InP doped with S to $8 \times 10^{18}$ cm$^{-3}$. There is no intentional strain grown into the epitaxial layers, and each quaternary composition has been individually lattice-matched to within $\Delta a/a_o \leq 2 \times 10^4$.

The device fabrication begins with the patterning, by standard photolithography, of 40 μm-wide stripes on a 1000 Å thickness of Si$_3$N$_4$ deposited on the InGaAsAlInAs-InP-InGaAsP QWH crystal. The Si$_3$N$_4$ serves as a mask for crystal etching and oxidation. Outside of the Si$_3$N$_4$ defining stripes, the region to be converted to oxide, the 1000 Å InGaAs cap is removed with a wet chemical selective etch (citric acid:H$_2$O:H$_2$O$_2$, 9 g:9 ml:3 ml) to expose the underlying AlInAs layer. The oxidation process (525° C., 1h) takes place in an open tube furnace supplied with N$_2$ bubbled through water held at 83° C., and results in a shiny uniform light blue oxide. The nitride masking stripes are removed from the sample in a CF$_4$ plasma, and next the crystal is lapped and polished from the substrate side to a thickness of $-150$ μm. The sample is then metallized with Ti/Au (p-side) and Ge/Au (n-side) and alloyed. Finally, individual lasers are cleaved, sawed, and mounted on In-coated copper heat sinks (p-side down) for continuous wave (cw) operation. The lasers operate continuously at $\lambda - 1.5$ μm at power levels from 0 to 140 mW per facet (uncoated cleaved facet), and at temperatures in the range 20° to 70° C.

EXAMPLE TWO
NON LIGHT-EMITTING DEVICES

Experiments have indicated that it is the presence of indium and/or phosphorus in the lower layer that retards oxidation of the lower layer. Thus, an oxidation-inhibiting lower layer 10 may include the oxidizable material aluminum, if the content of indium and/or phosphorus is sufficiently high. Preferably, the content of indium in a layer having an absence of phosphorus is a minimum of 50% by volume. An "oxidation-inhibiting layer" of In$_x$(Al$_y$Ga$_{1-y}$)$_{1-x}$P$_z$As$_{1-z}$, wherein y is greater than 0 and less than 1, is possible. Practical limitations, such as the nature of crystal growth, probably lead to the presence of some As in an In$_{0.5}$(Al$_{1-y}$Ga$_y$)$_{0.5}$P. The oxidation-inhibiting layer may be thin, so that a pseudomorphic layer may be applied in structures in which the layer is not inherently lattice matched to underlying semiconductor layers.

Figure 6:
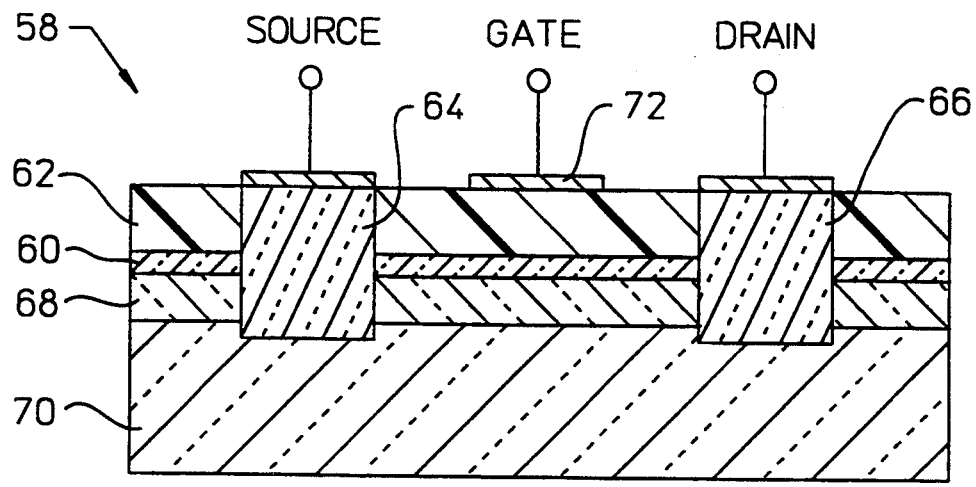
FIG. 6 is a side sectional view of a transistor formed in accordance with the present invention.

In addition to light-emitting devices, the approach may be used to form other electronic devices. For example, a field effect transistor (FET) may be formed such that the properties of the layer interface dominate the device behavior. Referring to FIG. 6, an FET 58 is shown as including an oxidation-inhibiting layer 60 of In$_x$(Al$_y$Ga$_{1-y}$)$_{1-x}$P$_z$As$_{1-z}$. The oxidation-inhibiting layer is an underlayer of an oxidized layer 62, which is the aluminum-bearing III-V semiconductor material. Oxidized portions of the layer 62 are regions of native oxide surrounding a source region 64 and a drain region 66.

The In$_x$(Al$_y$Ga$_{1-y}$)$_{1-x}$P$_z$As$_{1-z}$ layer 60 may function not only as a stop for oxidation at the interface of the layers 60 and 62, but also as a channel region in conjunction with a channel layer 613. The channel layer may be GaAs material on a GaAs substrate 70, with a thin In$_x$Ga$_{1-x}$As oxidation-inhibiting layer 60. For integration purposes, other epitaxial layers may be added, e.g., a GaAs contact layer 72 at the surface and an Al$_z$Ga$_{1-x}$As layer between the channel layer 68 and the substrate 70. Such layers allow the fabrication of both FETs and lasers on the same wafer, resulting in more sophisticated opto-electronic circuits. Furthermore, the oxidation-inhibiting layer may replace the channel layer, thus serving as both the channel (active) layer and the layer that retards oxidation.

Another specific example would be to replace the In$_x$Ga$_{1-x}$As oxidation-inhibiting layer 60 with an In$_x'$Ga$_{1-x'}$P or an In$_{x-1'}$(Al$_{y'}$Ga$_{1-y'}$)$_{1-x'}$P layer. In this case, the layer may be chosen to be either lattice matched ($x' \approx 0.5$) or pseudomorphic ($x' \lesssim 0.5$). Furthermore, the channel layer may be replaced by any other suitable III-V material. This approach may also be used to fabricate other electronic devices in which a sharp interface is desired, e.g. capacitors and waveguides.

Figure 7:
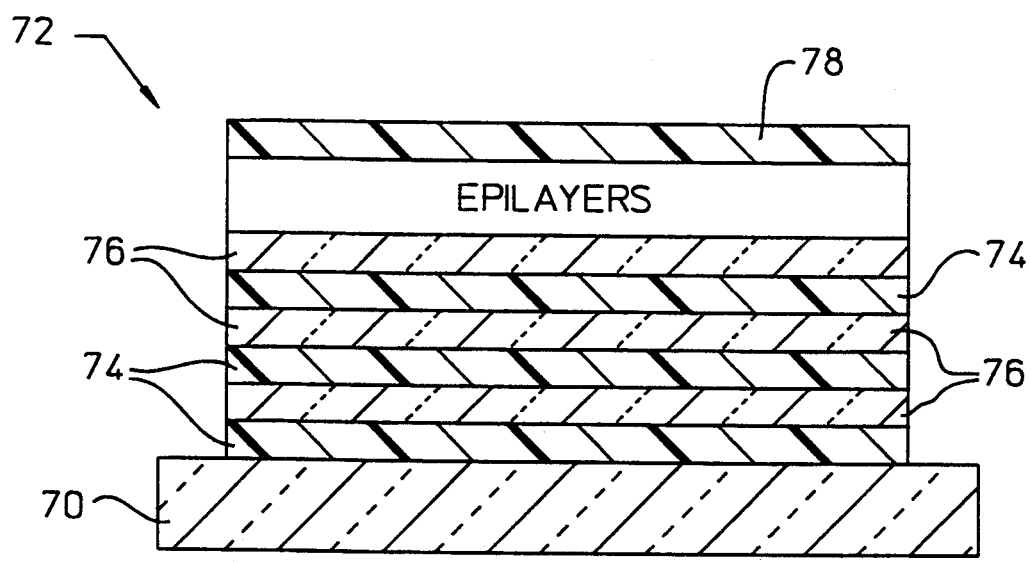
FIG. 7 is a side sectional view of a superlattice structure formed in accordance with the present invention.

A further application of oxidation-inhibiting layers is to form structures for selective oxidation. Thus, high quality buried native oxide structures may be realized by lateral oxidation. For example, FIG. 7 shows an embodiment in which a superlattice 72 is formed by epitaxially growing alternating layers of an oxidizable aluminum-bearing III-V semiconductor material and oxidation-inhibiting III-V semiconductor material. The aluminum-bearing layers 74 may be a high-gap $Al_x$-$Ga_{1-x}As$ material, while the oxidation-inhibiting layers 76 may be $In_x(Al_yGa_{1-y})_{1-x}P_zAs_{1-z}$ material. The superlattice 72 may be capped with a mask 78 and then etched to expose edges to be subjected to oxidation. Exposure of the superlattice to the proper environment will cause lateral oxidation. A lateral approach is described by Dallesasse et al. in "Hydrolyzation Oxidation of $Al_xGa_{1-x}As$-AlAs-GaAs Quantum Well Heterostructures and Superlattices," *Appl. Phys. Lett.* 57 (26), Dec. 24, 1990, pp. 2844–2846.

The resistance of the layers 76 to oxidation, as a result of the inclusion of In and/or P will result in only the Al-bearing layers 74 being oxidized. Thus, layers of high-index ($n \approx 3$) and the low-index ($n \approx 1.60$) insulating native oxide will be formed. The interfaces between the layers 74 and 76 will be sharp. If the layer thicknesses are properly designed, very high and very low reflectivity Bragg reflectors may be realized with a minimal number of periods. The structures have important implications in various devices,, such as vertical-cavity surface-emitting layers. It is noted that the formation of such a structure may be dependent upon the $In_x(Al_yGa_{1-y})_{1-x}P_zAs_{1-z}$ layer 76, since other layers may not provide sufficient sensitivity and/or sufficiently high quality interfaces to realize such a structure.

The oxidation process has an anisotropic rate dependence with direction, preceding much faster along the {110} direction for the oxidation of high-gap $Al_x$-$Ga_{1-x}As$. Thus, it should be possible to create buried native-oxide layers that extend over hundreds and potentially thousands of microns in a reasonable processing time. Furthermore, the process is selective, oxidizing only those areas that are exposed at the edges, making it possible to pattern the buried oxide over an entire wafer surface. The selectivity of-the oxidation process may result in an entire family of buried native-oxide structures in which a high-quality oxide with sharp structural and chemical interfaces is formed underneath and/or in between semiconductor layers. Consequently, the insulating properties of the native oxide may be used to locally isolate areas of the wafer, resulting in a novel form of III-V semiconductor-on-insulator technology in which the layers may be locally isolated.

We claim:

1. A method of fabricating a semiconductor device, comprising the steps of:
   providing a substrate;
   forming a first layer of oxidation-inhibiting III-V semiconductor material containing an element selected from the group consisting of indium and phosphorus;
   forming a second layer of an aluminum-bearing III-V semiconductor material on said first layer to provide an interface of said first and second layers; and
   forming an electrical connection from a contact layer to said first layer, including the substep of oxidizing at least one selected region of said second layer under oxidizing conditions such that an oxide extends to said interface of said first and second layers, and further including leaving an unoxidized region of said second layer such that said electrical connection from said contact layer is via said unoxidized region, thereby forming an electronic device.

2. The method of claim 1 wherein forming said first, second and contact layers and oxidizing said second layer are steps carried out such that said electronic device is a light-emitting device.

3. The method of claim 2 wherein forming said first, second and contact layers and oxidizing said second layers are carried out such that said electronic device is a transistor.

4. The method of claim 1 wherein said first layer is formed such that said first layer contains at least fifty percent indium by volume.

5. A method of forming a buried native oxide in a semiconductor device, comprising the steps of:
   forming a first layer of oxidation-inhibiting III-V semiconductor material containing an element selected from the group consisting of indium and phosphorus;
   forming, on said first layer, a second layer of an aluminum-bearing III-V semiconductor material;
   forming, on said second layer, a third layer of oxidation-inhibiting III-V semiconductor material containing an element selected from the group consisting of indium and phosphorus; and
   selectively oxidizing said second layer between said first and second layers by lateral oxidation.

6. A method of fabricating a semiconductor light-emitting device comprising:
   providing a substrate;
   forming a plurality of layers on said substrate, including forming an active region for lightwave generation;
   forming a laminated cladding structure on said plurality of layers, including forming a first semiconductor cladding film selected to inhibit oxidation and including a second semiconductor cladding film on said first semiconductor cladding film; and
   oxidizing selected first regions of said second semiconductor cladding film under oxidizing conditions such that oxide extends to an interface of said first and second semiconductor cladding films, said oxidizing including leaving a second region of said second semiconductor cladding film unoxidized.

7. The method of claim 6 further comprising forming a contact on said second region for electrical connection with said active region via said first semiconductor cladding film and said second region of said second semiconductor cladding film.

8. The method of claim 6 wherein forming said second semiconductor cladding film is a step of growing an aluminum-bearing semiconductor layer on said first semiconductor cladding film.

9. The method of claim 6 wherein forming said first semiconductor cladding film is a step of growing an InP layer.

10. The method of claim 9 wherein forming said plurality of films on said substrate includes forming an InP lower cladding layer on a side of said active region opposite to said laminated cladding structure.

11. The method of claim 6 wherein oxidizing selected first regions of said second semiconductor cladding film is a step including masking said second region and including employing wet oxidation techniques.

12. The method of claim 6 wherein forming said active region includes forming quantum wells.

13. A light-emitting device formed on a semiconductor substrate comprising:
   a semiconductor active layer for generating light in response to the conduction of current;
   a semiconductor first cladding layer on a side of said active layer opposite to said semiconductor substrate, said first cladding layer being resistive to oxidation;
   a second cladding layer on a side of said first cladding layer opposite to said active layer, said second cladding layer being generally planar and having an oxidized region and an unoxidized region, said oxidized region extending through said second cladding layer to said first cladding layer; and
   a contact in electrical contact with said oxidized region for electrical communication between said active layer and said first cladding layer.

14. The device of claim 13 wherein said first cladding layer is substantially aluminum-free and wherein said second cladding layer is formed of an aluminum-bearing semiconductor material.

15. The device of claim 13 wherein said first cladding layer is InP.

16. The device of claim 15 further comprising an InP lower cladding layer between said active layer and said semiconductor substrate.

17. The device of claim 13 wherein said second cladding layer is an epitaxial layer and wherein said oxidized region is a native oxide of said epitaxial layer.

18. The device of claim 13 wherein said oxidized region undercuts said contact.

19. A semiconductor laser comprising:
   a semiconductor substrate;
   a lower semiconductor layer means disposed on said substrate for confining current flow;
   an active region disposed on said lower cladding layer for generating light, said active region having a generally planar surface;
   an InP layer disposed on said generally planar surface of said active region for combining with said lower semiconductor layer means to confine current flow within said active region, said InP layer being substantially free of aluminum;
   an upper aluminum-bearing semiconductor layer disposed on said InP layer, said upper aluminum-bearing semiconductor layer having a native oxide region and an unoxidized region, said native oxide region extending to said InP layer; and
   contact means on said unoxidized region for channeling current to said active region via said unoxidized region and said InP layer.

20. The device of claim 19 wherein each of said semiconductor substrate and said lower semiconductor layer means is InP.

21. The device of claim 19 wherein said active region includes quantum wells.

22. The device of claim 20 wherein said upper aluminum-bearing semiconductor layer is primarily AlInAs.

23. The device of claim 19 wherein said upper aluminum-bearing semiconductor layer is substantially planar.

* * * * *